United States Patent
Van Dam (10) Patent No.: US 8,218,130 B2
(45) Date of Patent: Jul. 10, 2012

(54) DEVICE MANUFACTURING METHOD AND LITHOGRAPHIC APPARATUS, AND COMPUTER PROGRAM PRODUCT

(75) Inventor: Marinus Johannes Maria Van Dam, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 364 days.

(21) Appl. No.: 12/289,920

(22) Filed: Nov. 6, 2008

(65) Prior Publication Data

US 2009/0122290 A1     May 14, 2009

Related U.S. Application Data

(60) Provisional application No. 60/996,301, filed on Nov. 9, 2007.

(51) Int. Cl.
*G03B 27/32* (2006.01)
*G03B 27/42* (2006.01)

(52) U.S. Cl. ............................................. 355/77; 355/53

(58) Field of Classification Search .................... 355/50, 355/53, 55, 67
See application file for complete search history.

(56) References Cited

U.S. PATENT DOCUMENTS

| | | | |
|---|---|---|---|
| 5,710,619 A * | 1/1998 | Jain et al. | 355/50 |
| 5,795,687 A | 8/1998 | Yasuda | |
| 6,262,793 B1 | 7/2001 | Sasaya et al. | |
| 6,385,498 B1 * | 5/2002 | Hayashi | 700/121 |
| 6,509,952 B1 | 1/2003 | Govil et al. | |
| 6,573,975 B2 | 6/2003 | Govil et al. | |
| 6,753,948 B2 | 6/2004 | Taniguchi | |
| 2002/0054282 A1 | 5/2002 | Sasaya et al. | |
| 2002/0145719 A1 | 10/2002 | Govil et al. | |
| 2002/0163738 A1 | 11/2002 | Yoshihara | |
| 2003/0035090 A1 | 2/2003 | Imai et al. | |
| 2005/0030638 A1 | 2/2005 | Yoshihara | |

FOREIGN PATENT DOCUMENTS

| | | |
|---|---|---|
| JP | 06-310399 | 11/1994 |
| JP | 07-183190 | 7/1995 |
| JP | 07-183214 | 7/1995 |
| JP | 08-222495 | 8/1996 |
| JP | 08-293463 | 11/1996 |
| JP | 11-003856 | 1/1999 |
| JP | 2000-214382 | 8/2000 |
| JP | 2002-359184 | 12/2002 |
| JP | 2003-534652 T | 11/2003 |
| WO | 2004/112107 | 12/2004 |

OTHER PUBLICATIONS

Japanese Office Action mailed Apr. 18, 2011 in corresponding Japanese Patent Application No. 2008-282657.

* cited by examiner

*Primary Examiner* — Edward Glick
*Assistant Examiner* — Michelle Iacoletti
(74) *Attorney, Agent, or Firm* — Pillsbury Winthrop Shaw Pittman LLP (57) ABSTRACT

In a lithographic printing process a substrate is moved, in the scanning direction, relative to a patterned beam of radiation being projected onto it during a scanning exposure of a pattern feature. An image of the pattern feature is blurred in the scanning direction. The effect of the blurring is used to reduce a difference of critical dimension between similar horizontal and vertical features. The effect on critical dimension may be obtained by providing an amount of anamorphic magnification to the projection system.

15 Claims, 4 Drawing Sheets

DEVICE MANUFACTURING METHOD AND LITHOGRAPHIC APPARATUS, AND COMPUTER PROGRAM PRODUCT

This application claims priority and benefit to U.S. Provisional Patent Application Ser. No. 60/996,301, entitled "DEVICE MANUFACTURING METHOD AND LITHOGRAPHIC APPARATUS, AND COMPUTER PROGRAM PRODUCT", filed on Nov. 9, 2007. The content of that application is incorporated herein in its entirety by reference.

FIELD

The present invention relates to a method for manufacturing a device and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a pattern provided by a patterning device (e.g., a mask pattern or a reticle pattern) may be used to generate a circuit pattern to be formed on an individual layer of the IC. The circuit pattern can be transferred onto a target portion (e.g. comprising part of one or more dies) on a substrate (e.g. a silicon wafer). Transfer of the circuit pattern is typically via imaging of the pattern onto a layer of radiation-sensitive material (resist) provided on the substrate, using a projection system. A beam of radiation is patterned by having that beam traverse the patterning device, and is projected by the projection system onto a target portion on a substrate (silicon wafer) that has been coated with a layer of photo-activated resist (i.e., photoresist) material, such as to image the desired pattern in the resist. A lithographic printing process further includes a development of the resist layer after exposure such as to generate printed features, which may be features of resist material, or spaces in resist material. The resist material may serve as etch mask for an underlying layer to be patterned by etching.

In general, a single substrate will contain a network of adjacent target portions that are successively exposed to patterned radiation. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate substantially parallel or anti-parallel to this direction.

In the semiconductor industry, the continual demand for smaller semiconductor devices, having smaller patterns and features on the substrate, is pushing a requirement for improved control of a critical dimension (CD) of a printed feature.

Generally, a critical dimension of a feature of a pattern printed on the substrate depends on attributes of the projection system, the (patterned) beam of radiation, the pattern and the resist processing (including for example a pre- and post-exposure bake process, and a resist development). An attribute of a line feature of the pattern is for example the direction of the line. For example, the pattern may include horizontal and vertical line features, i.e., features having a line-shaped portion including a line segment respectively substantially perpendicular to the scanning direction and substantially parallel to the scanning direction of a scanner (or, when a stepper is used, respectively substantially perpendicular and substantially parallel to a side of a die as printed on the substrate). A desired line width of the line segment of both horizontal and vertical lines may be the same, however, the respective printed line width of the horizontal and vertical lines may be different, the difference generally referred to as a H-V difference.

SUMMARY

A H-V difference may occur when illumination of the pattern is performed with linearly polarized radiation and when the width of the horizontal and vertical features to be imaged are of the order of magnitude of the wavelength used. A control over H-V difference through a control of CD of the horizontal and vertical line features can be provided by modifying a characteristic of an illumination system arranged to illuminate the patterning device, such as for example a shape of an aperture limiting a cross sectional extent of the radiation beam upstream of the patterning device, or an intensity distribution within such an aperture.

However, any such modification may affect a CD-pitch characteristic and in particular a variation of the CD-pitch characteristic over an image field of the projection system. The term CD-pitch characteristic refers to a pitch dependent variation of printed CD as observed when both dense and isolated features of critical dimension are to be printed simultaneously. This phenomenon is also called "iso-dense bias". Such a variation may limit a process latitude, i.e. an available depth of focus in combination with an allowed amount of residual error in a dose of exposure of irradiated target portions for a given tolerance of the CD.

A CD-pitch characteristic can be compensated for by applying a bias to a size of the different features of the pattern. Such a biasing is also referred to as optical proximity correction (OPC). The OPC rules applied to a design of a pattern are field independent (e.g. the OPC rules are space invariant with respect to positions on the patterning device).

A compensation of a H-V difference by modifying a characteristic of the illumination system (thereby causing a field dependent iso-dense bias) may therefore induce a residual, field dependent CD-pitch error beyond tolerance.

It is desirable to alleviate the above-mentioned and/or other problem, and in particular to provide a method for controlling a CD of a feature and for controlling H-V difference, while avoiding introduction of field dependent CD-pitch error.

According to an aspect of the invention, there is provided a device manufacturing method for lithographically printing a feature on a surface of a substrate, the method comprising exposing the surface of the substrate to a pattern of radiation, the pattern including an image of the feature, moving the image relative to the substrate, during exposure, along a certain direction substantially parallel to the surface, and adjusting a size of the feature along the direction to a desired size by arranging a speed of the moving at a value different from zero.

According to an aspect of the invention, there is provided a lithographic apparatus including an illumination system configured to condition a radiation beam, a support constructed to hold a patterning device, the patterning device being capable of imparting the radiation beam with a pattern in its cross-section to form a patterned radiation beam, a substrate table constructed to hold a substrate, a projection system configured to project the patterned radiation beam onto a target portion of the substrate, a system constructed and arranged to provide a moving of an image of the pattern relative to the substrate, during exposure, along a certain direction substantially parallel to the surface, and a controller arranged to maintain a speed of the moving at a value different from zero.

According to an aspect of the invention, there is provided a scanning lithographic apparatus comprising an illumination system configured to condition a radiation beam, a support constructed to hold a patterning device, the patterning device being capable of imparting the radiation beam with a pattern in its cross-section to form a patterned radiation beam, a substrate table constructed to hold a substrate, a projection system configured to project the patterned radiation beam onto a target portion of the substrate and capable of providing anamorphic magnification resulting in a moving of an image of the pattern relative to the substrate, during exposure, along a scanning direction substantially parallel to the surface, and a controller arranged to maintain a speed of the moving at a value different from zero.

According to an aspect of the invention, there is provided a computer program product comprising instructions recorded on a computer readable medium, the instructions being adapted to control a lithographic apparatus to perform a device manufacturing method for lithographically printing a feature on a surface of a substrate, the method including exposing the surface of the substrate to a pattern of radiation, the pattern including an image of the feature, moving the image relative to the substrate, during exposure, along a certain direction substantially parallel to the surface, and adjusting a size of the feature along the direction to a desired size by arranging a speed of the moving at a value different from zero.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

A portion of the patterning device pattern irradiated by the illumination system of a scanning lithography apparatus is typically a slit shaped rectangular area, where in the non-scanning direction the size of the irradiated patterning device area corresponds to a maximum object field size of the projection system. Since the exposure region has a rectangular or slit-like shape, an optical element of the projection system proximate to the patterning device or the substrate may be irradiated in an area having a substantially rectangular or elliptical shape. Hence, such an optical element is subjected to irradiation in an area which is not rotationally symmetric with respect to an optical axis of the projection system. An optical element of the projection system proximate to a pupil of the projection system (optically conjugate to a pupil of the illumination system) may also be irradiated in a rotationally asymmetric area, depending on the redirection (e.g., diffraction) of radiation at the patterning device pattern and the intensity distribution of the radiation in the pupil of the illumination system. For example, in the presence of dipole illumination used for imaging at resolution of a pattern including unidirectional dense lines, an optical element proximate to the projection system pupil may be subjected to a corresponding dipolar irradiation (lacking rotational symmetry with respect to the optical axis). Consequently, a corresponding rotationally asymmetric deformation of projection system optical element may occur due to heating, induced during one or more exposures by a residual absorption of the beam radiation in the optical element and in its surface coating (if any). Such deformation can generate a rotationally asymmetric optical aberration leading to a H-V difference.

For example, the optical aberration may include a beyond-tolerance amount of third and higher order astigmatism, such that the position of best focus for a line-shaped feature of the pattern may become dependent on the orientation of the line. Astigmatism may severely degrade a device pattern image and cause a beyond tolerance amount of H-V difference.

According to an embodiment of the invention, a size-error of a line-shaped feature (such as for example a line width) which is dependent on a direction of the feature (such as H-V difference) is controlled and kept within tolerance by providing a controller 100 to set or adjust an anamorphic magnification of the projection system of a scanning lithography apparatus. The size error may be defined as a difference between a size along a certain direction (e.g., the scanning direction) of the feature and a desired size along that direction and for that feature.

In the absence of anamorphic magnification, a lithographic scanning projection apparatus operates at a nominal, rotationally symmetric magnification M (also referred to as reduction ratio M) for the imaging of the pattern onto the substrate. The exposure of a target portion of the substrate to the image of the pattern is provided by moving the pattern (e.g., the mask) along the scanning-direction, while synchronously moving, in substantially anti-parallel direction, the substrate along the scanning-direction such that the pattern image is substantially stationary with respect to the substrate. According to an embodiment of the invention, the image of the pattern is moved, along the scanning direction, relative to the substrate while the image is projected onto the substrate during the scanning exposure of a target portion. The image includes an image of the feature or features whose size is to be controlled. The relative movement is provided along the scanning direction. The speed of the relative movement may either vary during exposure or may be substantially constant during exposure, and is at least for a portion of the exposure time different from zero. As a result, the exposed image formed in resist will be blurred in the scanning direction. The effect of the blurring is to change a size, dimension, line width or CD, along the scanning direction of printed features of the pattern, and in particular to change a critical dimension CD of a horizontal line shaped portion of a printed feature.

The blurring can be provided by adjusting the magnification My in the Y-direction (the scanning direction) of the projection system away from the nominal rotationally symmetric magnification of the projection system: My=M+ΔMy while Mx=M, where My and Mx are the magnification along respectively a Y- and X-axis, the Y-axis being substantially parallel to the scanning direction. After applying such an adjustment, the projection system is characterized by an amount of anamorphic magnification, and the speed of the relative moving of the image with respect to the substrate is substantially constant (and different from zero) and proportional to ΔMy.

An amount of anamorphic magnification, as set by the controller 100 (to minimize, for example, a H-V difference), generates a corresponding relative movement between the patterned beam of radiation at substrate level (i.e., the image of the pattern) and the substrate during an exposure. An adjustment of the projection system to provide anamorphic magnification may include adjusting a position or shape of one or more optical elements of the projection system, or a part of the projection system, before starting exposure at the nominal scan speed synchronization (the synchronization based on the nominal symmetric magnification M). The effect on H-V difference of the relative movement may either be to provide an increase or a decrease of a CD along the Y-direction (the scanning direction) with respect to a CD along the X-direction of a similar feature.

Figure 1:
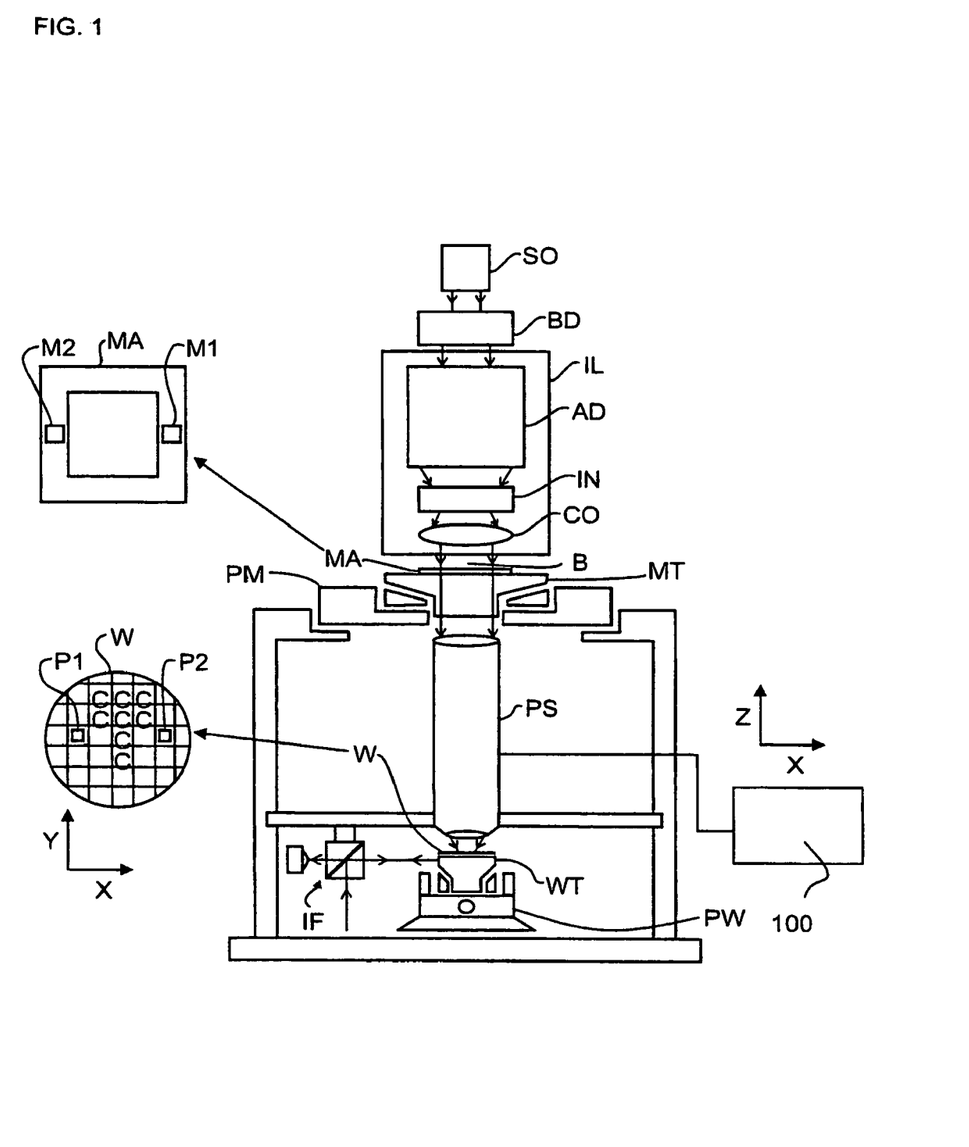
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation, for example generated by an excimer laser operating at a wavelength of 248 nm or 193 nm, or by a laser-fired plasma source operating at 13.6 nm);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, and catadioptric optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

2. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 2:
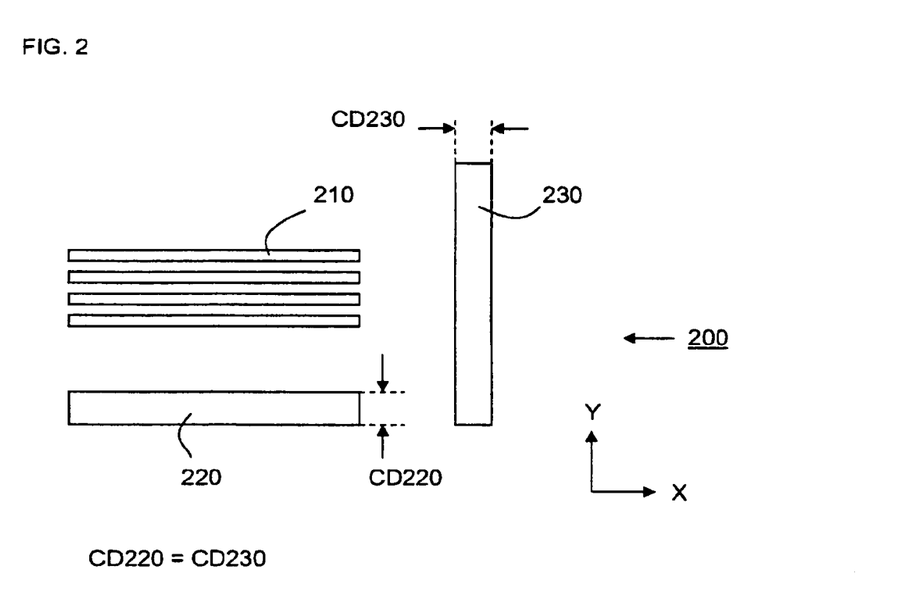
FIG. 2 illustrates a patterning device pattern with horizontal and vertical features.

In an embodiment of the invention, a patterning device pattern 200, as illustrated in FIG. 2, includes dense lines 210 and an isolated line 220, with structural directions substantially parallel to the X-direction, and an isolated line 230 with a structural direction substantially parallel to the Y-direction (the scanning direction of the apparatus used for imaging the pattern). The lines 220 and 230 have respective line widths CD220 and CD230, which nominally are the same: CD220=CD230.

Figure 3:
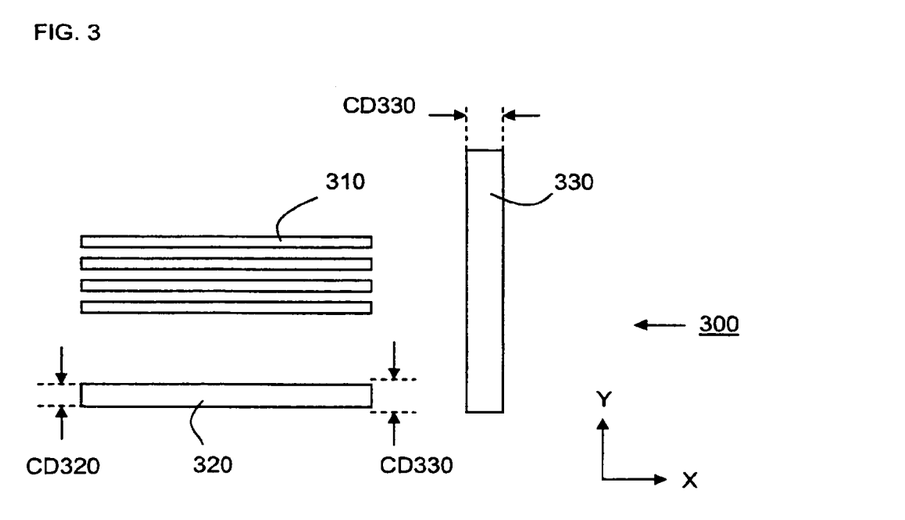
FIG. 3 illustrates a pattern in resist, in accordance with the pattern of FIG. 2.

FIG. 3 schematically illustrates the corresponding printed lines in resist, including horizontal dense lines 310, a horizontal line 320 and a vertical line 330. Due to, for example, an asymmetric heating in the imaging system including the projection system and the illumination system, the width CD320 of the printed line 320, in resist, is smaller than the width CD330 of the printed line 330 in resist. Hence, there is a H-V difference between the widths of the printed features 330 and 320 due to a size-error of the feature 320. According to an embodiment of the invention, information on the H-V difference is obtained. For example, a H-V difference $\Delta CD = CD320 - CD330$ can be measured by running a test lithographic process, and by measuring the widths CD320 and CD330 using, for example, a scanning electron microscope (SEM). Alternatively or additionally, the size error may be predicted using, for example, a computer simulation of the lithographic exposure and printing process. The computer simulation may be based on lithographic process data including measured or predicted projection system aberrations. The prediction of the aberrations may include a prediction of aberration effects induced by the aforementioned heating of one or more optical elements of the projection system.

Generally, a lithographic scanning projection apparatus operates at a magnification M (also referred to as reduction ratio M) of −0.25 for the imaging of the patterning device pattern onto the substrate: M=−0.25. In a scanning apparatus, the exposing of a target portion of the substrate W to the image of the pattern is provided by moving the mask MA (or when using a programmable patterning device, the pattern features) along the scanning-direction at a pattern scan-speed Vp, while synchronously moving, in substantially anti-parallel direction, the substrate W along the scanning-direction at a corresponding substrate scan-speed Vs. The ratio R of the substrate scan-speed Vs to the pattern scan-speed Vp is, in view of the magnification of the projection system, given by $R = Vs/Vp = M = -0.25$.

Figure 4:
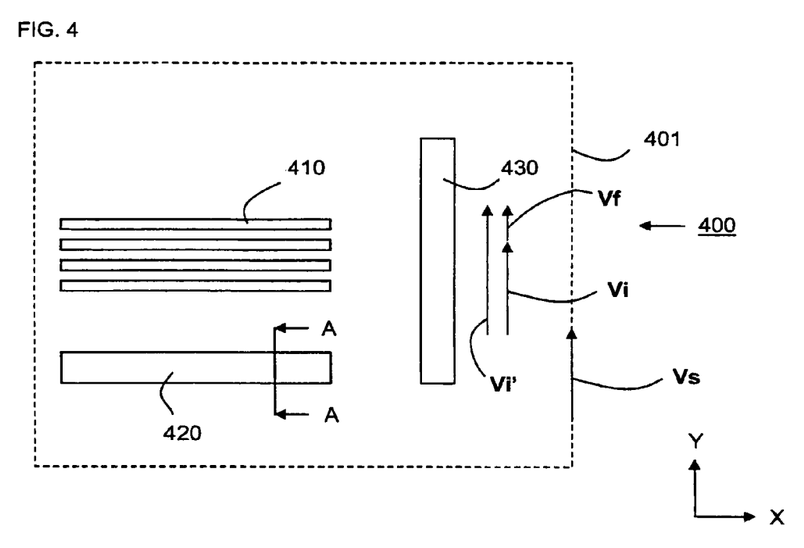
FIG. 4 illustrates an image of the pattern of FIG. 2 and its relative movement with respect to a substrate onto which the image is projected.

In FIG. 4 a portion 401 of the substrate W is illustrated. The scan direction and the scan speed Vs is indicated by respectively the vector Vs arrow and the length of the arrow. The image 400, on the substrate W, of the pattern 200 including features 210, 220, and 230 is indicated by the areas 410, 420 and 430. These areas can be unexposed areas in a bright field or exposed areas in a dark field. At the scan speed ratio R the image 400 is, during exposure, stationary with respect to the substrate. A scan direction and a scan speed Vi of the image 400 is indicated by respectively the vector Vi arrow and the length of the arrow. In the absence of CD control according to an embodiment of the invention, the image 400 of the pattern 200 is not moving with respect to the substrate during exposure, because the image scan direction and the image scan speed Vi are equal to the substrate scan direction and scan speed Vs as illustrated in FIG. 4 by the directions and lengths of the vectors Vi and Vs being substantially equal.

According to an embodiment of the invention, in the presence of size-error control, a desired fading along the scanning direction of the image 420 of feature 220 is provided by moving the image 400 relative to the substrate at a substantially constant fading speed Vf during exposure. A desired amount of fading is determined based on the obtained information on the size-error $\Delta CD$. The relative movement is obtained by adjusting the image scan speed Vi to a value Vi', which may either be a value lower than Vs or higher than Vs, while maintaining the average substrate scan speed Vs in accordance with Vs=M Vp. In FIG. 4 the length of the vector Vi' represents an image scan speed in the presence of size-error control and the length of the vector Vf represents the resulting relative fading speed Vf.

The fading speed Vf is linearly proportional to a change $\Delta My$ of magnification My of the projection system along the scanning direction. According to an embodiment, applying a change $\Delta My$ of magnification My is enabled by providing anamorphic magnification control of the projection system. In the absence of anamorphic magnification, the magnification M of the projection system is symmetric with respect to an optical axis of the projection system, so that My=Mx=M, where Mx is a magnification along a X-direction substantially perpendicular to the scanning direction. In the presence of a change ΔMy of magnification My the fading speed of the image 400 relative to the substrate is $$Vf=\Delta My\ Vp$$

Figure 5:
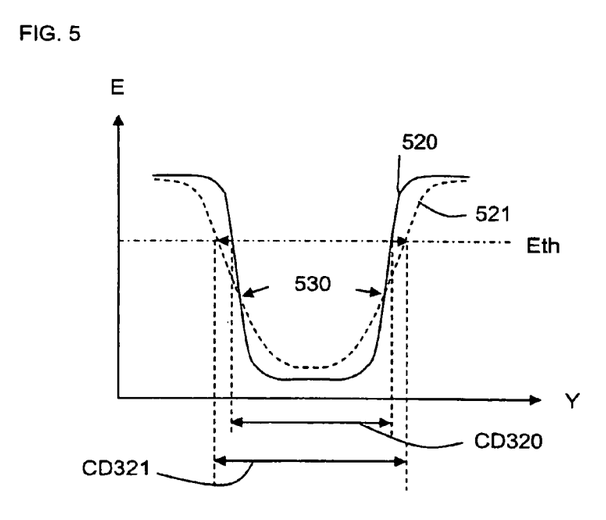
FIG. 5 depicts exposure dose distributions along a cross section of a feature of the image of FIG. 4 in the absence and in the presence of image fading.

An effect of fading is illustrated in FIG. 5. Along the vertical axis exposure dose E is plotted, and along the horizontal axis the Y-coordinate along the line AA in FIG. 4 is plotted. An exposure dose distribution 520 along the line AA in FIG. 4 is representative for a cross section of the image intensity in resist of the feature image 420 along the scan direction and in the absence of fading. The dashed curve 521 represents a similar cross section of the image in the presence of fading. In the present embodiment, the feature 220 is embodied such as to provide a dark, line-shaped image on the substrate W on a bright background.

The type of patterning device for providing such a line image is not essential, and may be any patterning device type such as a chrome on glass binary mask, an attenuated phase shifting mask (PSM), a chromeless PSM or an alternating PSM.

A threshold exposure energy at which a developable latent image in positive tone resist is formed is indicated by the exposure dose Eth, and an estimate for the line width (as obtained upon development of the resist) in the absence of fading is schematically indicated by the length CD320. After development of the exposed resist, a line feature of unexposed resist having a width CD320 is obtained.

An effect of fading of the feature image 420, as indicated by the curve 521, is that the width of the remaining resist feature is increased from CD320 to CD321 as indicated by the arrow CD321 in FIG. 5.

According to an embodiment of the invention, the image fading is provided by moving, during exposure, the image 400 relative to the substrate W at a substantially constant fading speed Vf. The increase of CD from CD320 to CD321 is generally a non-linear function of the fading speed Vf. The functional relationship between fading speed and change of CD320 can be established by executing a series of calibration lithographic printing processes, wherein the pattern 200 is printed on different target portions at different settings of the anamorphic magnification change ΔMy. Alternatively or additionally, the relationship may be obtained from computer simulation. A look up table including a plurality of CD changes linked to a plurality of anamorphic magnification change ΔMy values may be stored in a computer readable medium, and used for determining a desired fading speed Vf at which CD321 equals CD330, so that a H-V difference is reduced.

A typical range of values ΔMy at a reduction ratio M suitable for use with H-V control according to an embodiment of the invention is $3\times10^{-6}<\Delta My/M<15\times10^{-6}$.

A X,Y-symmetric magnification of a lithographic projection system can be adjusted by, for example, moving an optical lens element along an optical axis and relative to the rest of the optical assembly. The magnification adjustment will be equal in the X- and Y-directions since the effect of adjusting the position of the optical lens element is axially symmetrical around the optical axis of the optical assembly.

Figure 6:
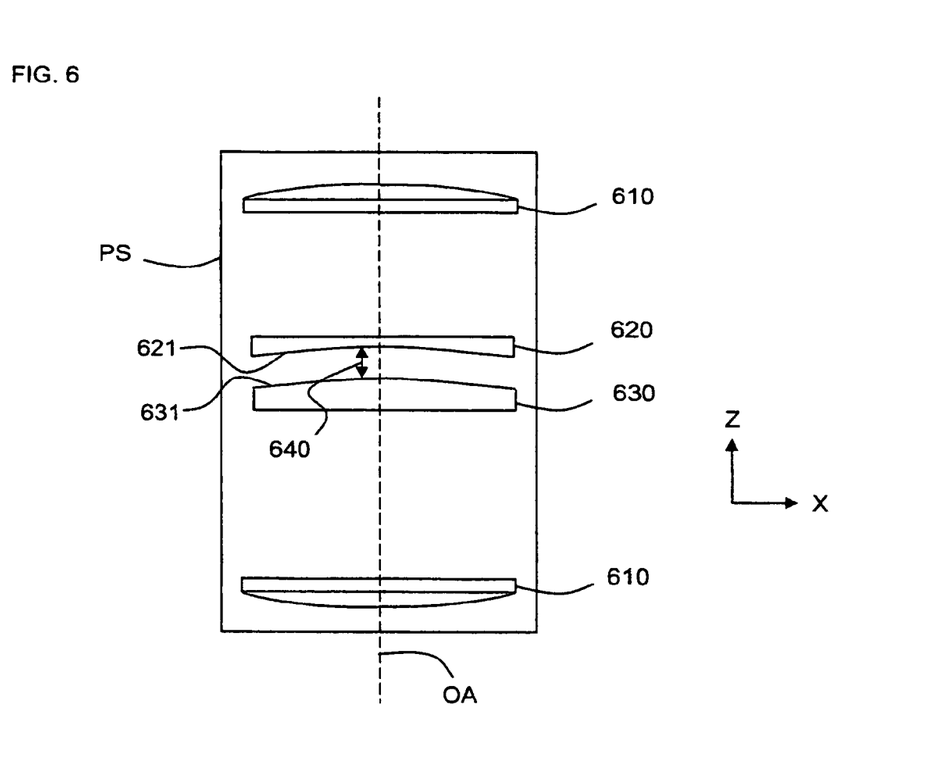
FIG. 6 illustrates a projection system arranged to provide anamorphic magnification.

To vary the magnification in the X-direction only, and as illustrated in FIG. 6, the projection system PS may be made up of, for example, several lens elements 610 with spherical surfaces (rotationally symmetric with respect to the optical axis OA of the projection system), and two elements 620 and 630 with cylindrical surfaces 621 and 631 respectively.

The element 620 is cylindrical such that its cylindrical surface 621 has no curvature in the Y-direction and is very weakly negative in the X-direction. The element 630 is cylindrical such that its cylindrical surface 631 has no curvature in the Y-direction and is very weakly positive in the X-direction. The focal length of element 620 is approximately equal and opposite in sign to that of element 630. Here, a magnification variation over the range of +−0.5% may be achieved. The magnification varies substantially linearly as a function of an axial displacement 640 of element 630 relative to element 620, and/or vice versa, along the axis OA.

A design of a projection system showing the feasibility of providing anamorphic magnification variation with a high-resolution lithographic lens can be gleaned from U.S. Pat. No. 5,710,619.

There are many possible arrangements of the projection system that would allow for an anamorphic magnification variation. A goal of a design is to minimize the number of elements and complexity of the required motion control. Other variations of the above embodiment are possible. For example, the cylindrical elements 620 and 630, for magnification control in one direction only, may be placed inside elements used for symmetric magnification control with similar results. Motion of both elements 620 and 630 relative to the rest of the projection system PS may be used to provide the magnification control, which may be beneficial if the required magnification range is very large or the range of travel needs to be reduced. Motion of both cylindrical elements 620 and 630 will generally be more complex than motion of one element only.

Another possible design choice includes two cylindrical elements for magnification control in the X-direction and two cylindrical elements for magnification control in the Y-direction, which allows for completely independent control of magnification in the two dimensions.

An alternative possible design choice is to use a projection system without the two cylindrical lenses 620 and 630 and including one or more optical elements that can be position-changed or shape-changed. For example the projection system may include an adaptive optical element having a spherical optical surface whose shape can be changed from axially symmetric to a saddle shaped surface by means of one or more manipulators arranged to exert suitable force to the optical element. Such an adaptive element may be arranged to primarily affect a spatial rate of change along the Y-direction of the value of Zernike aberration Z3. A change from a first substantially constant rate of change of Z3 along the Y-direction to a second substantially constant rate of change of Z3 along the Y-direction is equivalent to a change of magnification ΔMy.

Control of the optical magnification change ΔMy is provided by the controller 100. Above mentioned implementations to provide a change ΔMy, such as an axial displacement of a cylindrical lens or an optical element deformation manipulator setting, can be calibrated to establish a relation between a control signal provided by the controller 100 and the resulting magnification change ΔMy. Calibration data linking one or more displacements of one or more cylindrical lenses to respective magnification changes ΔMy can be stored as a look up table in a computer readable medium. Alternatively, or in addition, calibration data linking one or more optical element deformation manipulator settings to respective magnification changes ΔMy can similarly be stored as a look up table. Any such calibration data are referred to as anamorphic magnification control data.

According to an embodiment of the invention, a desired change of magnification along the Y-direction (to reduce H-V error) can be applied to the projection system wherein a determination of the control signal is based on a predicted or measured value of the size error, and on the anamorphic magnification control data. For use with the controller 100, there may be provided a computer program product comprising instructions recorded on a computer readable medium, the instructions being adapted to control a lithographic apparatus to perform the device manufacturing method for lithographically printing a feature on a surface of a substrate, the method including exposing the surface of the substrate to a pattern of radiation, the pattern including an image of the feature, moving the image relative to the substrate, during exposure, along a preselected direction substantially parallel to the surface, and adjusting a size of the feature along the preselected direction to a desired size by arranging a speed of the moving at a value different from zero. When executing the program, a controller 100 included in a scanner apparatus may fetch or receive anamorphic magnification control data, as well as information on a size of the feature and a desired size. Based on that data, the controller is arranged to calculate and apply a desired value of $\Delta My$ to the projection system PS.

An advantage of the above described method is that a size of an elongated feature extending along a direction substantially perpendicular to the scanning direction of the apparatus can be affected and controlled independently from a size of a same elongated feature or another elongated feature extending along the scanning direction. In particular, the size CD320 of the horizontal feature 320 in FIG. 3 can be adjusted without affecting the size CD330 of the vertical feature 330.

A method to control CD of a feature or CD uniformity of different similar features across a target portion includes inclining the substrate table relative to a best image plane for the nominal wavelength of the radiation during a scanning. As a result, each part of the target portion is exposed at a whole range of axial positions along a Z-direction substantially perpendicular to the best image plane. The range is centered around a best focus position, and the resulting imaging of a feature includes a superposition of corresponding defocused feature images. This gives a smearing effect similar to that described above, however the smearing is isotropic with respect to any direction in the X,Y plane of the image. Therefore, with such a CD control method, an advantage of an embodiment of the present invention is unattainable. Similarly, other methods of CD control, such as methods based on source bandwidth varying or on varying any parameter that affects iso-dense bias including an illumination setting such as σ and a projection system setting such as spherical aberration, cannot provide CD control of horizontal features independent from CD control of vertical features.

An additional or alternative advantage of the CD control method based on controlling anamorphic magnification of the projection system is that an effect on CD of, for example, a horizontal line-shaped feature such as feature 320 is substantially field independent. The relative movement during scanning exposure of the feature image 420 with respect to the substrate as induced by the change of magnification $\Delta My$ is independent of the position along the X-axis of the pattern 200. Therefore, the induced fading and CD adjustment is field independent, which contributes to improved CD uniformity.

The CD control method according to an embodiment of the invention may affect an iso-dense bias between printed dense features and printed similar but more isolated features. However, since the effect on CD is field uniform, as explained above, a disturbance of an iso-dense bias characteristic is also field uniform. Such a field uniform disturbance of iso-dense bias can be compensated by applying a known iso-dense control method such as varying exposure dose, varying a source radiation spectral bandwidth, varying an illumination σ setting, and/or a projection system NA setting.

An embodiment of the invention is not limited to a control of printed CD for avoiding an occurrence of difference in printed size of features that are dependent on structural direction of line-shaped features such as shown in FIG. 2. The effect of fading to create a smearing of a feature-image can be used to adjust and control any feature size along a direction substantially parallel to the scanning direction. Thus, an embodiment of the invention can be used to adjust an elliptically shaped feature (with ellipse axes along the X and Y-directions) such as to change the shape into a circular one by adjusting the size along the Y-axis. Similarly, an embodiment of the invention is not limited to controlling the CD of horizontal and vertical line features. A fading can be applied equally well to, for example, a line shaped feature directed along an axis at an angle to the scanning direction.

Further, an embodiment of the invention is not limited to a situation wherein due to an asymmetric error in the imaging system the width of a horizontal feature in resist is smaller than the width of a similar vertical feature in resist. For example if, in FIG. 5, the threshold exposure dose Eth of the resist is lower than the value of the exposure dose associated with iso-fading points 530 (the points where the curves 520 and 521 intersect), an effect of fading of the dark line against the bright background is a narrowing of the printed line. Therefore, an embodiment of the invention may be used to correct a H-V difference where, in the absence of compensation according to an embodiment of the invention, the width of a horizontal feature in resist is larger than the width of a similar vertical feature in resist.

An embodiment of the invention is not limited to the use of a scanner to control a size of a feature along a preselected direction independent of a size of the feature along a direction substantially perpendicular to the preselected direction. A stepper may be and is conventionally provided with a short stroke device for moving the patterning device MA and/or the support structure MT along the X and Y directions illustrated in FIG. 1. Therefore, a device manufacturing method for lithographically printing a feature on a surface of a substrate including exposing the surface of the substrate to a pattern of radiation, the pattern including an image of the feature, moving the substrate, relative to the image, during exposure along a preselected direction substantially parallel to the surface, and controlling a size of the feature along the preselected direction by arranging a speed of the moving at a constant value different from zero, may readily be implemented by using the short stroke device to provide the moving. A moving of the patterning device in this embodiment is obtained by scaling up the desired moving of the substrate relative to the image in accordance with the magnification factor M of the projection system. Alternatively or additionally, the substrate table may be moved during exposure using a short stroke actuator arranged and constructed to laterally (e.g. in X and Y directions in FIG. 1) position the substrate table WT with respect to the projection system PS.

Consequently, according to an embodiment of the invention there is provided a device manufacturing method for lithographically printing a feature on a surface of a substrate including exposing the surface of the substrate to a pattern of radiation, the pattern including an image of the feature, moving the image relative to the substrate, during exposure, along a preselected direction substantially parallel to the surface, and adjusting a size of the feature along the preselected direction to a desired size by arranging a speed of the moving at a value different from zero. In particular, the arranging a speed of the moving at a value different from zero may include obtaining a functional relationship between the speed of the moving and a change of the size of the feature. For example, a plurality of calibration lithographic printing processes wherein the feature is printed at a corresponding plurality of speeds of the moving the image relative to the substrate may be executed, in combination with measuring a corresponding plurality of sizes of the feature.

A lithographic apparatus according to an embodiment of the invention may include—besides an illumination system configured to condition a radiation beam, a support constructed to hold a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate—a system constructed and arranged to provide a moving of an image of the pattern relative to the substrate, during exposure, along a preselected direction substantially parallel to the surface, and a controller arranged to maintain a speed of the moving at a value different from zero. The system may include a device to move the support in scaled relation to the moving of the image of the pattern relative to the substrate and/or a device to move the substrate table in accordance with the moving of the image of the pattern relative to the substrate. The controller 100 is arranged to set the speed of the moving of the image at a value different from zero in accordance with a difference between an actual and a desired size, along the preselected direction, of a feature, the feature being generated by lithographically printing the feature on a surface of a substrate in accordance with the method mentioned above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A device manufacturing method for lithographically printing a feature on a surface of a substrate, the method comprising:
    exposing the surface of the substrate to a pattern of radiation, the pattern including an image of the feature;
    moving the image relative to the substrate, during exposure, along a certain direction substantially parallel to the surface; and
    adjusting a size of the feature along the direction to a desired size by arranging a speed of the moving to increase to an absolute value different from zero to cause blurring of at least part of the exposed image.

2. The method of claim 1, wherein the desired size corresponds to a size along a direction different from the certain direction of another feature on the surface of the substrate.

3. The method of claim 2, wherein the direction different from the certain direction is the direction substantially perpendicular to the certain direction.

4. The method of claim 1, wherein a scanning apparatus is used to expose the surface and wherein the certain direction is a scanning direction of the scanning apparatus.

5. The method of claim 4, wherein arranging a speed includes adjusting an anamorphic magnification of a projection system of the scanning apparatus.

6. The method of claim 5, wherein a ratio of a difference between a magnification along the scanning direction and a direction substantially perpendicular to the scanning direction to the magnification along the direction substantially perpendicular to the scanning direction has a value larger than $3 \times 10^{-6}$ and smaller than $15 \times 10^{-6}$.

7. The method of claim 1, wherein arranging a speed includes obtaining data representing a functional relationship between the speed of the moving and a change of the size of the feature.

8. The method of claim 7, wherein obtaining includes executing a plurality of calibration lithographic printing processes wherein the feature is printed at a corresponding plurality of speeds of the moving the image relative to the substrate, and measuring a corresponding plurality of sizes of the feature.

9. The method of claim 1, wherein arranging a speed includes obtaining a functional relationship between the speed of the moving and a change of the size of the feature.

10. The method of claim 9, wherein obtaining includes executing a plurality of calibration lithographic printing processes wherein the feature is printed at a corresponding plurality of settings of anamorphic magnification along a scanning direction, and measuring a corresponding plurality of sizes of the feature.

11. A lithographic apparatus including:
    an illumination system configured to condition a radiation beam;
    a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion on a surface of the substrate;

a system constructed and arranged to provide a moving of an image of the pattern relative to the substrate, during exposure, along a certain direction substantially parallel to the surface; and a controller arranged to increase a speed of the moving to an absolute value different from zero to cause blurring of at least part of the exposed image.

12. The apparatus of claim 11, wherein the apparatus is a stepper and the system includes a device to move the support in scaled relation to the moving of the image of the pattern relative to the substrate and a controller arranged to set the speed of the moving at a value different from zero in accordance with a difference between an actual and a desired size, along the certain direction, of a feature, the feature being generated by lithographically printing the feature on a surface of a substrate in accordance with the method of claim 1.

13. The apparatus of claim 11, wherein the apparatus is a stepper and the system includes a device to move the substrate table in accordance with the moving of the image of the pattern relative to the substrate and a controller arranged to set the speed of the moving at a value different from zero in accordance with a difference between an actual and a desired size, along the certain direction, of a feature, the feature being generated by lithographically printing the feature on a surface of a substrate in accordance with the method of claim 1.

14. A scanning lithographic apparatus comprising:

an illumination system configured to condition a radiation beam;

a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion on a surface of the substrate and configured to provide anamorphic magnification resulting in a moving of an image of the pattern relative to the substrate, during exposure, along a scanning direction substantially parallel to the surface; and a controller arranged to increase a speed of the moving to an absolute value different from zero to cause blurring of at least part of the exposed image.

15. A non-transient computer readable medium comprising instructions recorded thereon, the instructions configured to control a lithographic apparatus to perform a device manufacturing method for lithographically printing a feature on a surface of a substrate, the method comprising:

exposing the surface of the substrate to a pattern of radiation, the pattern including an image of the feature;

moving the image relative to the substrate, during exposure, along a certain direction substantially parallel to the surface; and adjusting a size of the feature along the direction to a desired size by arranging a speed of the moving to increase to an absolute value different from zero to cause blurring of at least part of the exposed image.

* * * * *